United States Patent
Do et al.

(10) Patent No.: US 8,595,575 B2
(45) Date of Patent: *Nov. 26, 2013

(54) SEMICONDUCTOR MEMORY DEVICE, TEST CIRCUIT, AND TEST OPERATION METHOD THEREOF

(75) Inventors: Chang-Ho Do, Gyeonggi-do (KR); Bok-Moon Kang, Dublin, CA (US); Tae-Hyung Jung, Santa Clara, CA (US); Yeon-Woo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 336 days.

This patent is subject to a terminal disclaimer.

(21) Appl. No.: 12/982,423

(22) Filed: Dec. 30, 2010

(65) Prior Publication Data

US 2012/0170382 A1 Jul. 5, 2012

(51) Int. Cl.
*G01R 31/28* (2006.01)

(52) U.S. Cl.
USPC .......................................... 714/731

(58) Field of Classification Search
USPC ................................. 714/718, 719
See application file for complete search history.

(56) References Cited

U.S. PATENT DOCUMENTS

| | | | | |
|---|---|---|---|---|
| 3,878,510 | A * | 4/1975 | Smith | 307/115 |
| 6,058,495 | A * | 5/2000 | Lee et al. | 714/718 |
| 6,550,026 | B1 * | 4/2003 | Wright et al. | 714/719 |
| 7,246,280 | B2 | 7/2007 | Kim et al. | |
| 2002/0040454 | A1 * | 4/2002 | Raad et al. | 714/719 |
| 2006/0291299 | A1 * | 12/2006 | Nanba | 365/189.07 |
| 2009/0037784 | A1 * | 2/2009 | Kim et al. | 714/719 |

FOREIGN PATENT DOCUMENTS

| | | |
|---|---|---|
| KR | 1020080114303 | 12/2008 |
| KR | 1020090122677 | 12/2009 |
| KR | 1020100011751 | 2/2010 |
| KR | 1020100050138 | 5/2010 |

* cited by examiner

*Primary Examiner* — Michael Maskulinski
*Assistant Examiner* — Neil Miles
(74) *Attorney, Agent, or Firm* — IP & T Group LLP

(57) ABSTRACT

A semiconductor memory device includes a plurality of banks, each including a plurality of first memory cells and a plurality of second memory cells, a first input/output unit configured to transfer first data between the first memory cells and a plurality of first data pads, a second input/output unit configured to transfer second data between the second memory cells and a plurality of second data pads, a path selection unit configured to transfer the first data which are input through the first data pads, to both the first and second memory cells, during a test mode, and a test mode control unit configured to compare the first data of the first and second memory cells, and to control the first data pads to denote a fail status based on a comparison result, during the test mode.

39 Claims, 10 Drawing Sheets

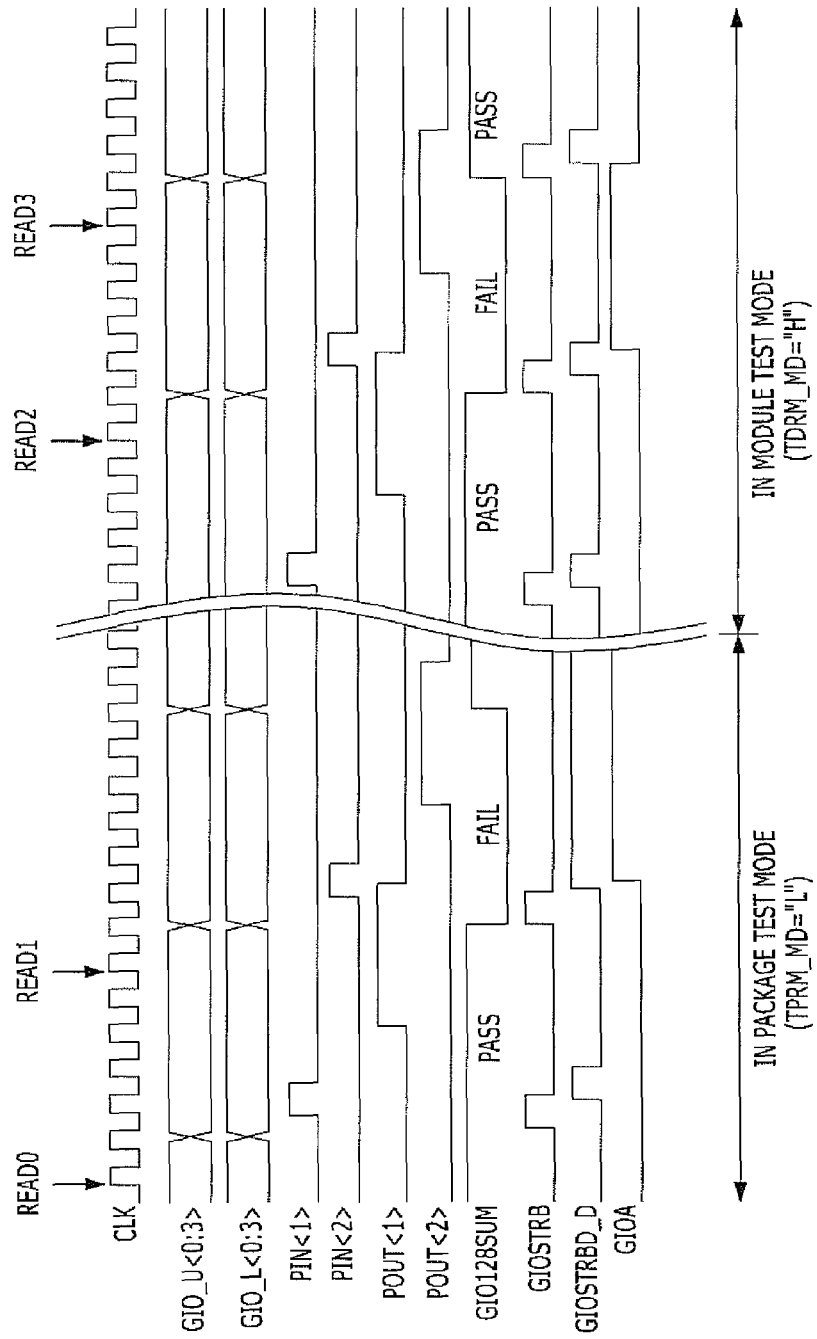

SEMICONDUCTOR MEMORY DEVICE, TEST CIRCUIT, AND TEST OPERATION METHOD THEREOF

BACKGROUND OF THE INVENTION

Exemplary embodiments of the present invention relate to semiconductor memory devices, and more particularly, to a semiconductor memory device, a test circuit, and a test operation method thereof.

A dynamic random access memory (DRAM), which is widely used among memory devices, includes a plurality memory cells for storing data. As the number of memory cells integrated in the semiconductor memory device increases, more time and money are consumed for testing the memory cells in the semiconductor memory device. Therefore, a parallel test scheme has been developed and applied to test memory cells of a semiconductor memory device at a wafer or a package level.

According to the parallel test scheme, test data are inputted to two or more memory cells in a bank of a semiconductor memory device. The memory cells store and output the test data. The outputted test data are compared to determine whether or not the memory cells have a defect.

A conventional semiconductor memory device includes an additional test pin on a chip to output the comparison result, i.e., a test result. Furthermore, where the semiconductor memory device is used as a memory module, in which plural chips are modularized, there are demands for a circuitry that may test a semiconductor memory device in a module state. When such a test is performed on a semiconductor memory device that is mounted on a system, the test is called a mounting test. Further, the conventional semiconductor memory device includes an additional test pin on a chip to output the comparison result, i.e., a test result. In order to reduce the chip size, there are demands for a circuitry that may test a semiconductor memory device without the additional test pin, and decrease a test time.

SUMMARY OF THE INVENTION

Exemplary embodiments of the present invention are directed to a semiconductor memory device capable of decreasing a test time of a plurality of unit cells.

Other exemplary embodiments of the present invention are directed to a semiconductor memory device capable of testing a plurality of unit cells according to various test modes.

In accordance with an exemplary embodiment of the present invention, a semiconductor memory device includes a plurality of banks, each including a plurality of first memory cells and a plurality of second memory cells, a first input/output unit configured to transfer first data between the first memory cells and a plurality of first data pads, a second input/output unit configured to transfer second data between the second memory cells and a plurality of second data pads, a path selection unit configured to transfer the first data which are input through the first data pads, to both the first and second memory cells, during a test mode, and a test mode control unit configured to compare the first data of the first and second memory cells, and to control the first data pads to denote a fail status based on a comparison result, during the test mode.

In accordance with another exemplary embodiment of the present invention, an apparatus for testing a semiconductor memory device, includes a fail detection unit configured to compare data of first memory cells with data of second memory cells and to output a fail detection signal based on the comparison result, a latch unit configured to latch the fail detection signal and to output a fail latch signal in response to a test mode signal which is activated during the test mode, a mode decision signal for determining a test mode type, and a strobe signal which is toggled when a read command is input, first and second test signal generation units configured to generate first and second test signals based on the fail latch signal and the mode decision signal, and a fail signal output unit configured to receive the first and second test signals, and output first and second fail signals in response to a test output signal, which is activated after data are output through data pads.

In accordance with yet another exemplary embodiment of the present invention, a method of testing a semiconductor memory device includes transferring data, which is input through a data pad, to first and second memory cells of a bank, comparing the data of the first memory cell with the data of the second memory cell to output a fail detection signal based on the comparison result, generating a fail latch signal by latching the fail detection signal in response to a mode decision signal for determining a test mode type, and a strobe signal which is toggled when a read command is input, generating a fail signal based on the fail latch signal and the mode decision signal, and driving the data pad to denote a fail status based on the fail signal.

BRIEF DESCRIPTION OF THE DRAWINGS

FIG. 4B is a timing diagram illustrating an operation of the latch unit in accordance with an exemplary embodiment of the present invention.

DESCRIPTION OF SPECIFIC EMBODIMENTS

Figure 1:
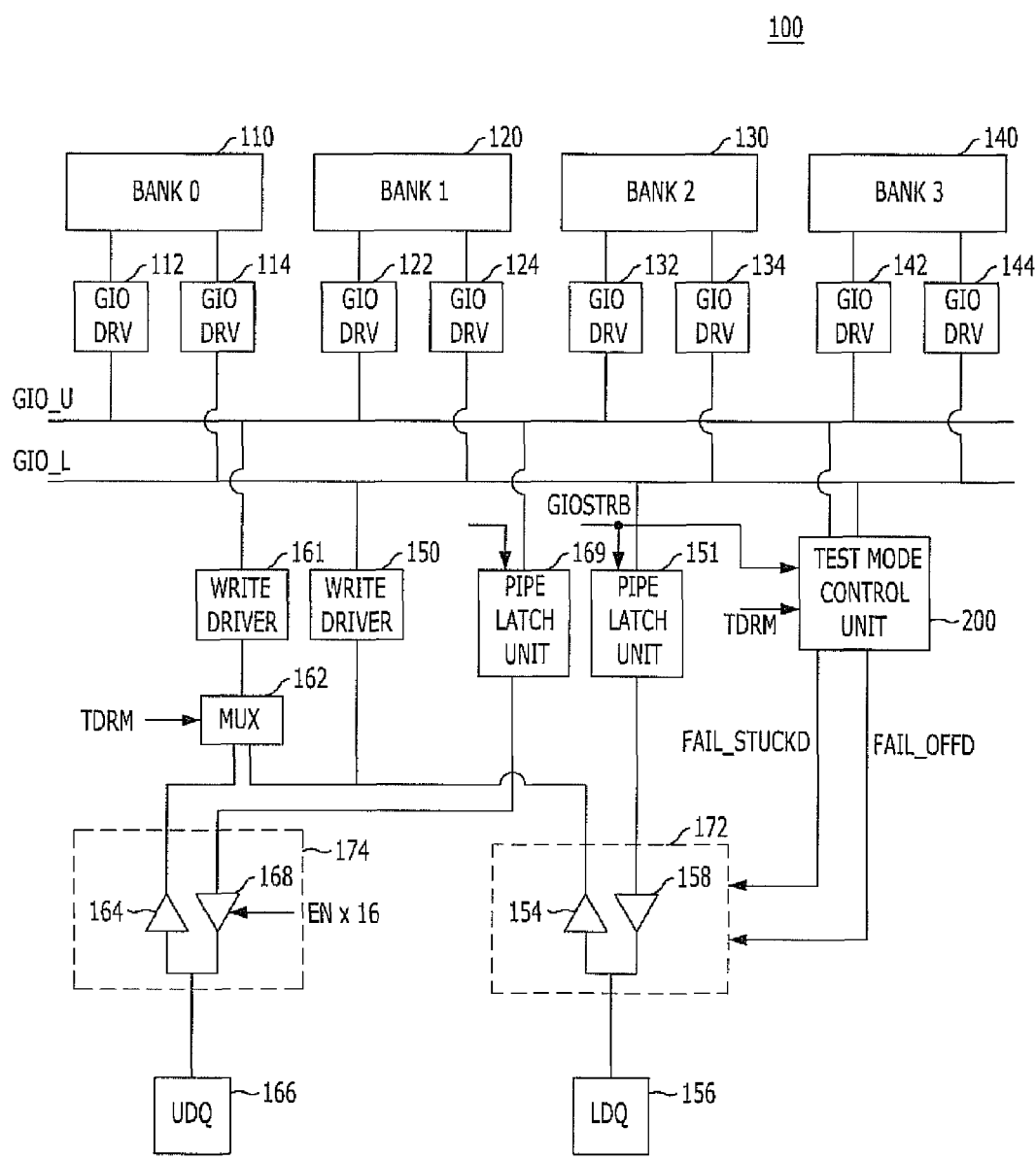
FIG. 1 is a block diagram illustrating a semiconductor memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor memory device in accordance with an exemplary embodiment of the present invention.

Referring to FIG. 1, the semiconductor memory device includes a plurality of banks, for example, four banks, 110 to 140, global input/output (GIO) line drivers 112 to 144, write drivers 150 and 161, pipe latch units 151 and 169, a multiplexer 162, input/output (I/O) drivers 172 and 174, and a test mode control unit 200.

The I/O drivers 172 and 174 are configured to drive data inputted/outputted from/to data pads LDQ and UDQ, respectively. In more detail, the I/O drivers 172 and 174 are provided with input buffers 154 and 164 and output drivers 158 and 168, respectively. The input buffers 154 and 164 receive data inputted from the data pads LDQ and UDQ, respectively. The input buffer 154 outputs the data it receives to the write driver 150 and the multiplexer 162. The input buffer 164 outputs the data it receives to the multiplexer 162. Further, the output drivers 158 and 168 receive data outputted from the pipe latch units 151 and 169, and output data to the data pads LDQ and UDQ, respectively. In accordance with this exemplary embodiment of the present invention, in a test mode, the output driver 158 drives the data pad LDQ to a high-impedance state in response to a fail-off signal FAIL_OFFD, or to maintain a high-stuck state in response to a fail-stuck signal FAIL_STUCKD.

The write drivers 150 and 161 transfer data to corresponding memory cells of the banks 110 to 140. The pipe latch units 151 and 169 output data of the corresponding GIO lines GIO_L and GIO_U to the data pads LDQ and UDQ through the output drivers 158 and 168, respectively. The memory cells included in the banks 110 to 140 store data and output the stored data through the corresponding GIO lines GIO_L and GIO_U.

In accordance with this exemplary embodiment of the present invention, in the test mode, the multiplexer 162 selects a path between the write driver 161 and the input buffer 154 in response to a test mode signal TDRM. Here, the test mode signal TDRM is a signal which is activated during the test mode of a semiconductor memory device. As a result, while the write driver 150 transfers test data inputted from the data pad LDQ to memory cells coupled to the GIO lines GIO_L, the write driver 161 also transfers the same test data inputted from the data pad LDQ to memory cells coupled to the GIO lines GIO_U. That is, both of the write drivers 150 and 161 receive the test data from the data pad LDQ and transfer the test data to respective memory cells in the banks 110 to 140.

In a normal mode, the multiplexer 162 selects a path between the write driver 161 and the input buffer 164 in response to the test mode signal TDRM which is inactivated during the normal mode. As a result, the write driver 150 transfers data inputted from the data pad LDQ to its corresponding memory cells, i.e., memory cells coupled to GIO lines GIO_L, and the write driver 161 transfers data inputted from the data pad UDQ to its corresponding memory cells, i.e., memory cells coupled to GIO lines GIO_U. That is, each of the write drivers 150 and 161 receives and transfers respective data from the data pads LDQ and UDQ to memory cells in the banks 110 to 140.

The test mode control unit 200 receives data outputted from the GIO lines GIO_L and GIO_U. In the test mode, the test mode control unit 200 compares data of the GIO lines GIO_U with data of the GIO lines GIO_L in response to the test mode signal TDRM, and outputs the fail-off signal FAIL_OFFD and the fail-stuck signal FAIL_STUCKD based on a comparison result.

Figure 2:
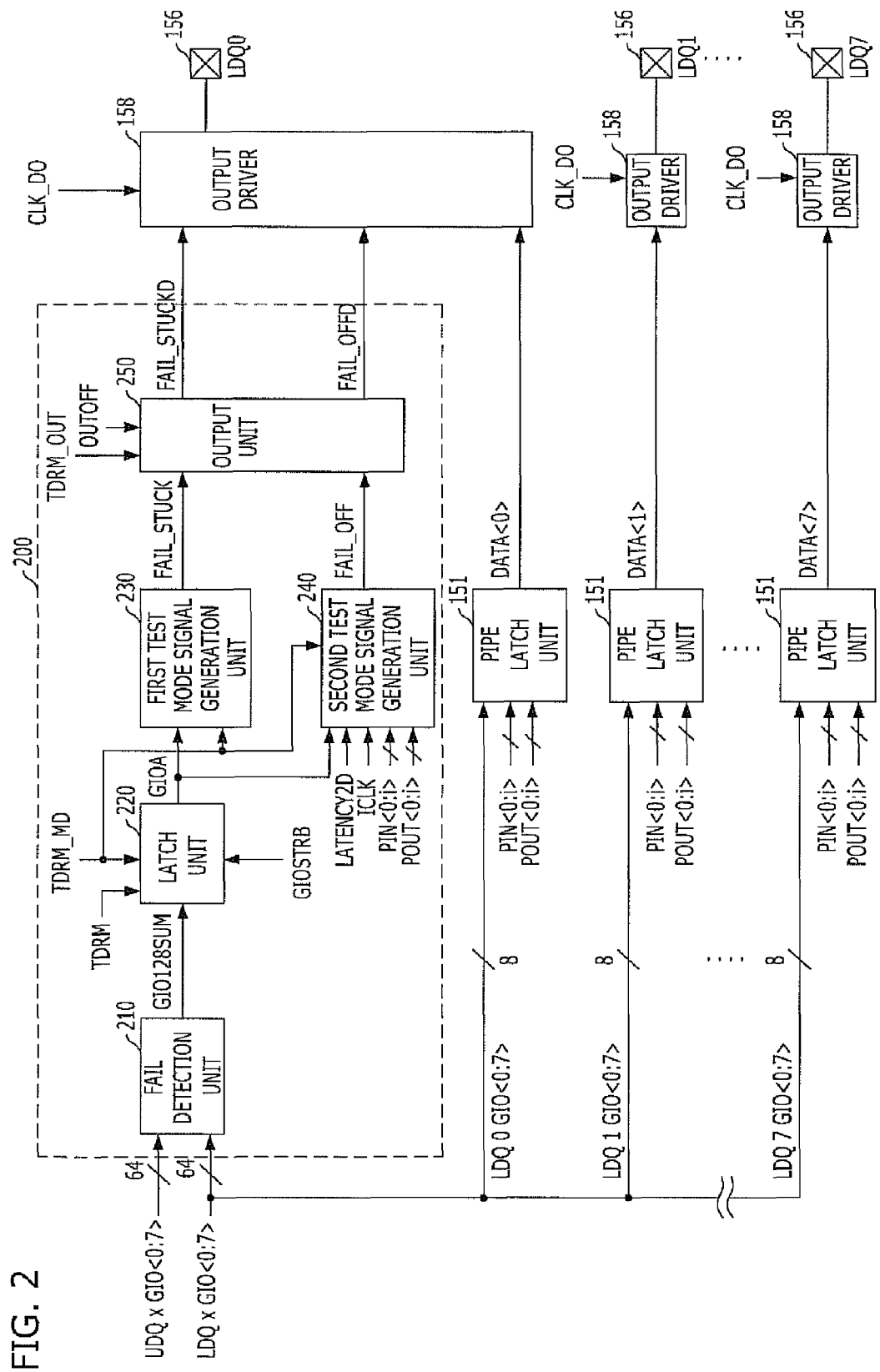
FIG. 2 is a block diagram illustrating a test mode control unit, an output driver, and a pipe latch unit shown in FIG. 1.

FIG. 2 is a block diagram illustrating the test mode control unit 200, the output driver 158, and the pipe latch unit 151 shown in FIG. 1. Hereinafter, for sake of convenience, an exemplary case, in which 8 GIO lines GIO_U and 8 GIO lines GIO_L are provided, and 8 data pads LDQ and 8 data pads UDQ are provided, will be explained.

Referring to FIG. 2, the test mode control unit 200 includes a fail detection unit 210 and a latch unit 220, and a first test signal generation unit 230, a second test signal generation unit 240, and a fail signal output unit 250.

The fail detection unit 210 compares data UDQxGIO<0:7> of the GIO lines GIO_U with data LDQxGIO<0:7> of the GIO lines GIO_L to output a fail detection signal GIO128SUM. The fail detection signal GIO128SUM is inactivated when any of the data UDQxGIO<0:7> of the GIO lines GIO_U is different from a corresponding one of the data LDQxGIO<0:7> of the GIO lines.

The latch unit 220 latches the fail detection signal GIO128SUM to output a fail latch signal GIOA in response to the test mode signal TDRM, a mode decision signal TDRM_MD, and a strobe signal GIOSTRB. Here, the mode decision signal TDRM_MD represents a test mode type such as a module test and a package test. In the preferred embodiment, the mode decision signal TDRM_MD is activated in the module test mode which is performed by mounting the semiconductor memory device on an actual application device, and is inactivated in the package test mode which is performed on the semiconductor memory device alone. The strobe signal GIOSTRB may be generated based on a pipe input strobe signal PINSTB used in the pipe latch units 151 and 169, which is synchronized with a read command. In accordance with this exemplary embodiment of the present invention, during the module test mode, the latch unit 220 outputs the fail latch signal GIOA by latching the fail detection signal GIO128SUM in synchronization with the strobe signal GIOSTRB which toggles whenever each read command is input. On the other hand, during the package test mode, the latch unit 220 outputs the fail latch signal GIOA, which is stuck at a certain logic level after the fail detection signal GIO128SUM is inactivated, regardless of the strobe signal GIOSTRB.

The first test signal generation unit 230 generates a first test signal FAIL_STUCK based on the fail latch signal GIOA and the mode decision signal TDRM_MD. The second test signal generation unit 240 generates a second test signal FAIL_OFF based on the fail latch signal GIOA, the mode decision signal TDRM_MD, a CAS latency signal LATENCY2D, an internal clock ICLK, pipe latch input control signals PIN<0:i>, and pipe latch output control signals POUT<0:i>.

The fail signal output unit 250 receives the first and second test signals FAIL_STUCK and FAIL_OFF and outputs the fail-off signal FAIL_OFFD and the fail-stuck signal FAIL_STUCKD in response to a test output signal TDRM_OUT and an off-driver signal OUTOFF. Here, the test output signal TDRM_OUT is activated after the test data of the GIO lines GIO_L are outputted through first to eighth data pads LDQ0 to LDQ7 by the pipe latch unit 151 at a test mode such as the package test mode, and the off-driver signal OUTOFF is generated based on an inverted output enable signal, which is activated to a logic low level during a read operation, and inactivated to a logic high level after the read operation is finished. Here, the fail signal output unit 250 outputs the fail-off signal FAIL_OFFD to drive the first data pad LDQ0 to a high-impedance state, or outputs the fail-stuck signal FAIL_STUCKD to drive the first data pad LDQ0 to a high/low-stuck state.

As describe above, in the normal mode, the pipe latch unit 151 receives the data LDQxGIO<0:7> from the GIO lines GIO_L, and outputs data DATA<0:7> to the output driver 158. As a result, the output driver 158 outputs the data DATA<0:7> to corresponding data pads among the first to eighth data pads LDQ0 to LDQ7, and thus the read operation is normally performed.

On the contrary, in the test mode, the test mode control unit 200 compares data UDQxGIO<0:7> of the GIO lines GIO_U with data LDQxGIO<0:7> of the GIO lines GIO_L, and outputs the fail-off signal FAIL_OFFD and the fail-stuck signal FAIL_STUCKD in response to a comparison result. As a result, when a fail occurs, the output driver 158 drives the first data pad LDQ0 to a high-impedance state in response to the fail-off signal FAIL_OFFD, or to a high-stuck state in response to the fail-stuck signal FAIL_STUCKD, and thus, the first data pad LDQ0 shows a failure of the semiconductor memory device.

In FIG. 2, the fail-stuck signal FAIL_STUCKD and the fail-off signal FAIL_OFFD are input to the output driver 158 driving the first data pad LDQ0. However, in the preferred embodiment, the fail-stuck signal FAIL_STUCKD and the fail-off signal FAIL_OFFD may be input to all the output drivers 158 driving the first to eighth data pads LDQ0 to LDQ7 so that all the data pads LDQ0 to LDQ7 may denote a failure of the semiconductor memory device. In another embodiment, a switch unit may be provided between the fail signal output unit 250 and each of the output drivers 158 driving the second to eighth data pads LDQ1 to LDQ7. The switch unit may provide the fail-stuck signal FAIL_STUCKD and the fail-off signal FAIL_OFFD to any number of selected output drivers 158 to control which of the data pads LDQ0 to LDQ7 indicate a failure of the semiconductor memory device. Further, the switch unit may be controlled by an external command, or may be implemented with a metal option.

Figure 3:
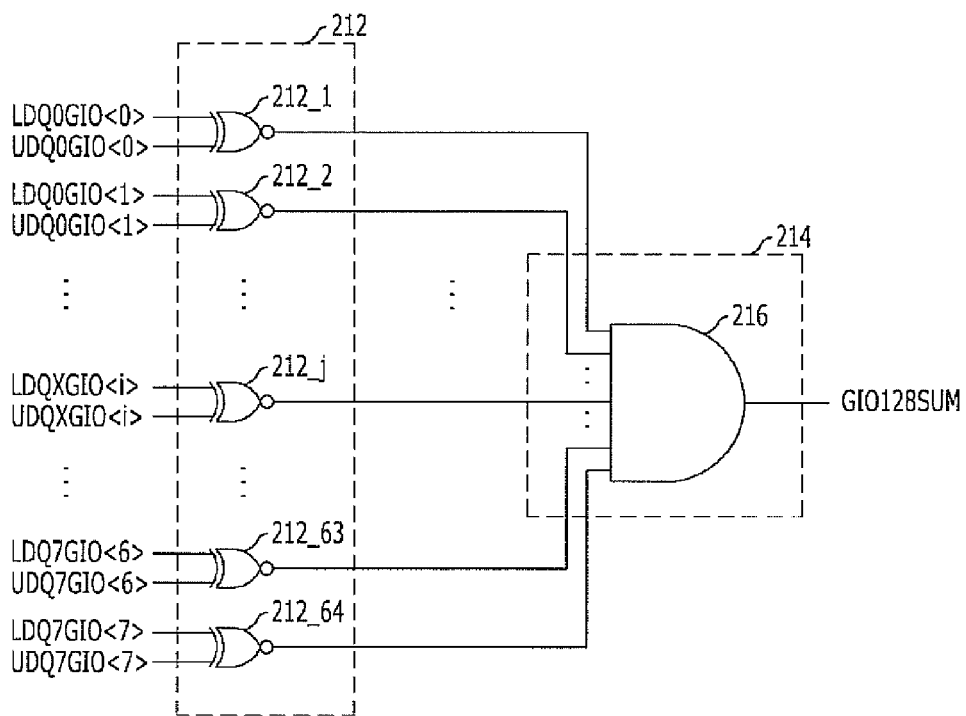
FIG. 3 is a circuit diagram illustrating a comparison unit shown in FIG. 2.

FIG. 3 is a circuit diagram illustrating the fail detection unit 210 shown in FIG. 2.

Referring to FIG. 3, the fail detection unit 210 includes a comparison unit 212 and a summation unit 214. The comparison unit 212 includes a plurality of, for example, XNOR gates 212_1 to 212_64 configured to receive the respective data UDQxGIO<0:7> and LDQxGIO<0:7>. The summation unit 214 includes, for example, an AND gate 216 configured to receive outputs of the plurality of XNOR gates 212_1 to 212_64.

Each of XNOR gates 212_1 to 212_64 activates its output signal when corresponding data UDQxGIO<0:7> and LDQxGIO<0:7> are identical with each other. The AND gate 216 activates the fail detection signal GIO128SUM when all the output signals of the XNOR gates 212_1 to 212_64 are activated, but inactivates the fail detection signal GIO128SUM when any one of the output signals of the XNOR gates 212_1 to 212_64 is inactivated.

Accordingly, the fail detection unit 210 inactivates the fail detection signal GIO128SUM when any one of the data UDQxGIO<0:7> is different from a corresponding one of the data LDQxGIO<0:7>.

Figure 4A:
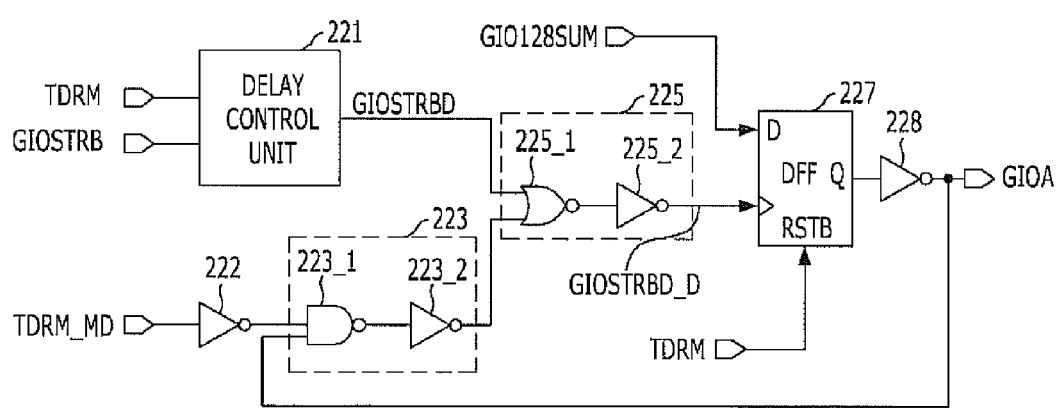
FIG. 4A is a circuit diagram illustrating a latch unit shown in FIG. 2.

FIG. 4A is a circuit diagram illustrating the latch unit 220 shown in FIG. 2.

Referring to FIG. 4A, the latch unit 220 includes a delay control unit 221, a feedback unit 223, a combination unit 225, a D flip-flop 227, and inverters 222 and 228.

The delay control unit 221 is enabled in response to the test mode signal TDRM, and delays the strobe signal GIOSTRB to output a delayed strobe signal GIOSTRBD. For reference, the delay control unit 221 delays the strobe signal GIOSTRB by a delay amount corresponding to a time taken by the fail detection unit 210 to generate the fail detection signal GIO128SUM. As a result, the delayed strobe signal GIOSTRBD is synchronized with the fail detection signal GIO128SUM. Here, the strobe signal GIOSTRB is generated based on a pipe input strobe signal PINSTB which is generated in synchronization with a read command.

The feedback unit 223 feeds back the fail latch signal GIOA to the combination unit 225 in response to the mode decision signal TDRM_MD. In detail, the feedback unit 223 includes a NAND gate 223_1 and an inverter 223_2, which perform an AND operation on the fed-back fail latch signal GIOA and an inverted signal of the mode decision signal TDRM_MD. As a result, the feedback unit 223 feeds back the fail latch signal GIOA to the combination unit 225 in the package test mode. Here, the inverter 222 generates the inverted signal of the mode decision signal TDRM_MD by inverting the mode decision signal TDRM_MD.

The combination unit 225 combines an output signal of the feedback unit 223 and the delayed strobe signal GIOSTRBD to output a clock signal GIOSTRBD_D of the D flip-flop 227. In detail, the combination unit 225 includes a NOR gate 225_1 and an inverter 225_2, which perform an OR operation on the output signal of the feedback unit 223 and the delayed strobe signal GIOSTRBD.

The D flip-flop 227 latches the fail detection signal GIO128SUM in synchronization with the clock signal GIOSTRBD_D. Herein, the D flip-flop 227 is reset in response to the test mode signal TDRM. Finally, the inverter 228 outputs the fail latch signal GIOA by inverting an output signal of the D flip-flop 227.

Hereinafter, referring to FIGS. 4A and 4B, an operation of the latch unit 220 will be explained in detail.

FIG. 4B is a timing diagram illustrating an operation of the latch unit 220.

In a test mode, test data are input from the data pad LDQ and transferred to the respective memory cells in the banks.

After a read command is input, the test data stored in the respective memory cells in the banks are loaded on the corresponding GIO lines GIO_L and GIO_U as data UDQxGIO<0:7> and LDQxGIO<0:7>. The delay control unit 221 of the latch unit 220 is enabled in response to the test mode signal TDRM, and outputs the delayed strobe signal GIOSTRBD by delaying the strobe signal GIOSTRB. The combination unit 225 outputs the clock signal GIOSTRBD_D to the D flip-flop 227 based on the delayed strobe signal GIOSTRBD, and the D flip-flop 227 latches the fail detection signal GIO128SUM in synchronization with the clock signal GIOSTRBD_D. Finally, the inverter 228 outputs the fail latch signal GIOA by inverting the output signal of the D flip-flop 227.

First, it is assumed that the fail detection signal GIO128SUM becomes inactivated in the package test mode where the mode decision signal TDRM_MD is inactivated. At this time, since the mode decision signal TDRM_MD is inactivated, the feedback unit 223 feeds back the fail latch signal GIOA to the combination unit 225, and the combination unit 225 outputs the clock signal GIOSTRBD_D fixed to a logic high level. As a result, the D flip-flop 227 is in a stuck state, and thus, the fail latch signal GIOA is fixed to a logic high level. Accordingly, in the package test mode, the latch unit 220 latches and outputs the fail latch signal GIOA having a logic high level once a fail occurs.

Next, it is assumed that the fail detection signal GIO128SUM becomes inactivated in the module test mode where the mode decision signal TDRM_MD is activated. At this time, since the mode decision signal TDRM_MD is activated, the feedback unit 223 does not feed back the fail latch signal GIOA to the combination unit 225, and the combination unit 225 outputs the clock signal GIOSTRBD_D based on the delayed strobe signal GIOSTRBD. As a result, the D flip-flop 227 latches the fail detection signal GIO128SUM whenever the read command is input. Accordingly, in the module test mode, the latch unit 220 outputs the fail latch signal GIOA by detecting a fail status in real-time in synchronization with the clock signal GIOSTRBD_D, which continuously toggles at each read operation.

Figure 5:
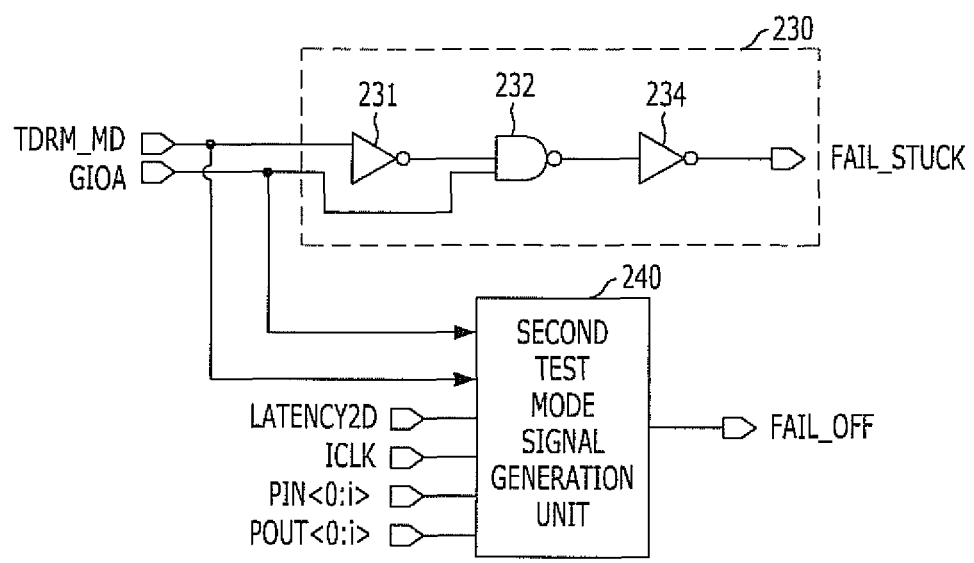
FIG. 5 is a block diagram illustrating first and second test signal generation units shown in FIG. 2.

FIG. 5 is a block diagram illustrating first and second test signal generation units 230 and 240 shown in FIG. 2.

Referring to FIG. 5, the first test signal generation unit 230 includes a NAND gate 232 and inverters 231 and 234. The inverter 231 inverts the mode decision signal TDRM_MD. The NAND gate 232 and the inverter 234 perform an AND operation on an output of the inverter 231 and the fail latch signal GIOA, and outputs the first test signal FAIL_STUCK. Accordingly, the first test signal generation unit 230 outputs the fail latch signal GIOA as the first test signal FAIL_STUCK when the mode decision signal TDRM_MD is inactivated in the package test mode.

The second test signal generation unit 240 generates the second test signal FAIL_OFF in response to the fail latch signal GIOA, the mode decision signal TDRM_MD, the CAS latency signal LATENCY2D, the internal clock ICLK, the pipe latch input control signals PIN<0:i>, and the pipe latch output control signals POUT<0:i>. Accordingly, in the module test mode, the second test signal generation unit 240 generates the second test signal FAIL_OFF by synchronizing the fail latch signal GIOA with an output timing of data through the DQ pads LDQ and UDQ.

Figure 6:
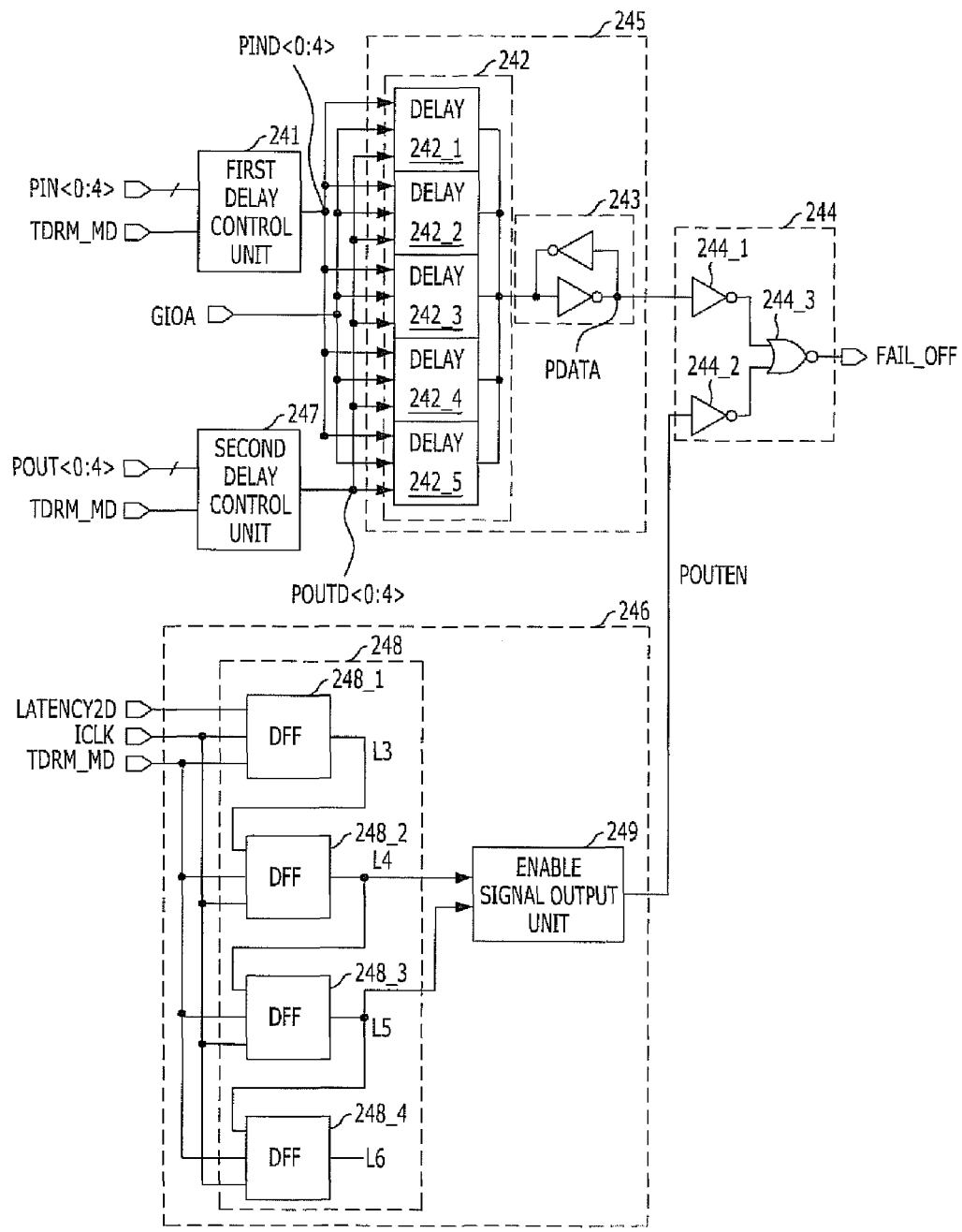
FIG. 6 is a block diagram illustrating the second test signal generation unit shown in FIG. 5.

FIG. 6 is a block diagram illustrating the second test signal generation unit 240 shown in FIG. 5.

Referring to FIG. 6, the second test signal generation unit 240 includes first and second delay control units 241 and 247, a pipe latch unit 245, an output enable signal generation unit 246, and a combination unit 244.

The first delay control unit 241 is enabled in response to the mode decision signal TDRM_MD, and delays pipe latch input control signals PIN<0:4> to output delayed pipe latch input control signals PIND<0:4> to the pipe latch unit 245. The second delay control unit 247 is enabled in response to the mode decision signal TDRM_MD, and delays pipe latch output control signals POUT<0:4> to output delayed pipe latch output control signals POUTD<0:4> to the pipe latch unit 245. Here, the pipe latch input control signals PIN<0:4> are signals used to receive normal data in the pipe latch units 151 and 169 shown in FIG. 1, and the pipe latch output control signals POUT<0:4> are signals used to output the normal data in the pipe latch units 151 and 169 shown in FIG. 1. For reference, a delay amount of the first and second delay control units 241 and 247 corresponds to a time taken to synchronize the fail latch signal GIOA with the pipe latch input control signals PIN<0:4> and the pipe latch output control signals POUT<0:4>, respectively.

The pipe latch unit 245 sequentially latches the fail latch signal GIOA in synchronization with the delayed pipe latch input control signals PIND<0:4> and the delayed pipe latch output control signals POUTD<0:4>, and outputs a pipe output data PDATA. In more detail, the pipe latch unit 245 includes an alignment unit 242 and an inverter latch unit 243. The alignment unit 242 includes a plurality of delay units 242_1 to 242_5, each sequentially receiving the fail latch signal GIOA in response to the respective delayed pipe latch input control signals PIND<0:4>, and sequentially outputting the received data in response to the respective delayed pipe latch output control signals POUTD<0:4>. The inverter latch 243 includes two inverters, and inverts and latches an output of the alignment unit 242 to output the pipe output data PDATA.

The output enable signal generation unit 246 generates a pipe latch output enable signal POUTEN by shifting the CAS latency signal LATENCY2D to be in synchronization with the internal clock ICLK, in the module test mode. In more detail, the output enable signal generation unit 246 includes a shift unit 248, and an enable signal output unit 249. The shift unit 248 is enabled in response to the mode decision signal TDRM_MD, and shifts the CAS latency signal LATENCY2D in synchronization with the internal clock ICLK. The enable signal output unit 249 receives an output signal of the shift unit 248 to output the pipe latch output enable signal POUTEN.

In the preferred embodiment, the shift unit 248 includes a plurality of D flip-flops 248_1 to 248_5, each being reset in response to the mode decision signal TDRM_MD. The first D flip-flop 248_1 latches the CAS latency signal LATENCY2D in synchronization with the internal clock ICLK, and the second to fifth D flip-flops 248_2 to 248_5 latch an output of the previous D flip-flop in synchronization with the internal clock ICLK. Herein, the CAS latency signal LATENCY2D is activated in response to a CAS latency after the read command is input. In the preferred embodiment, the enable signal output unit 249 receives an output L4 of the second D flip-flop 248_2 and an output L5 of the third D flip-flop 248_3 to generate the pipe latch output enable signal POUTEN which maintains an activated logic level for a duration between activation timings of the output L4 and the output L5. Although the preferred embodiment uses the output L4 and the output L5, the present invention is not limited to this structure. For example, the enable signal output unit 249 may use outputs L3 and L4, or outputs L5 and L6.

The combination unit 244 receives the pipe output data PDATA and the pipe latch output enable signal POUTEN and outputs the second test signal FAIL_OFF. In detail, the combination unit 244 includes first and second inverters 244_1 and 244_2, and a NOR gate 244_3. The first inverter 244_1 receives the pipe output data PDATA, and the second inverter 244_2 receives the pipe latch output enable signal POUTEN. The NOR gate 244_3 performs a NOR operation on outputs of the first and second inverters. Accordingly, the combination unit 244 activates the second test signal FAIL_OFF when the pipe output data PDATA is activated during the activation duration of the pipe latch output enable signal POUTEN.

As described above, in this embodiment of the present invention, the second test signal generation unit 240 is implemented with a pipe latch circuit substantially identical to that used in the pipe latch units 151 and 169 shown in FIG. 1. Accordingly, a timing for outputting the second test signal FAIL_OFF may be synchronized with a timing for outputting data through the DQ pads LDQ and UDQ.

Figure 7:
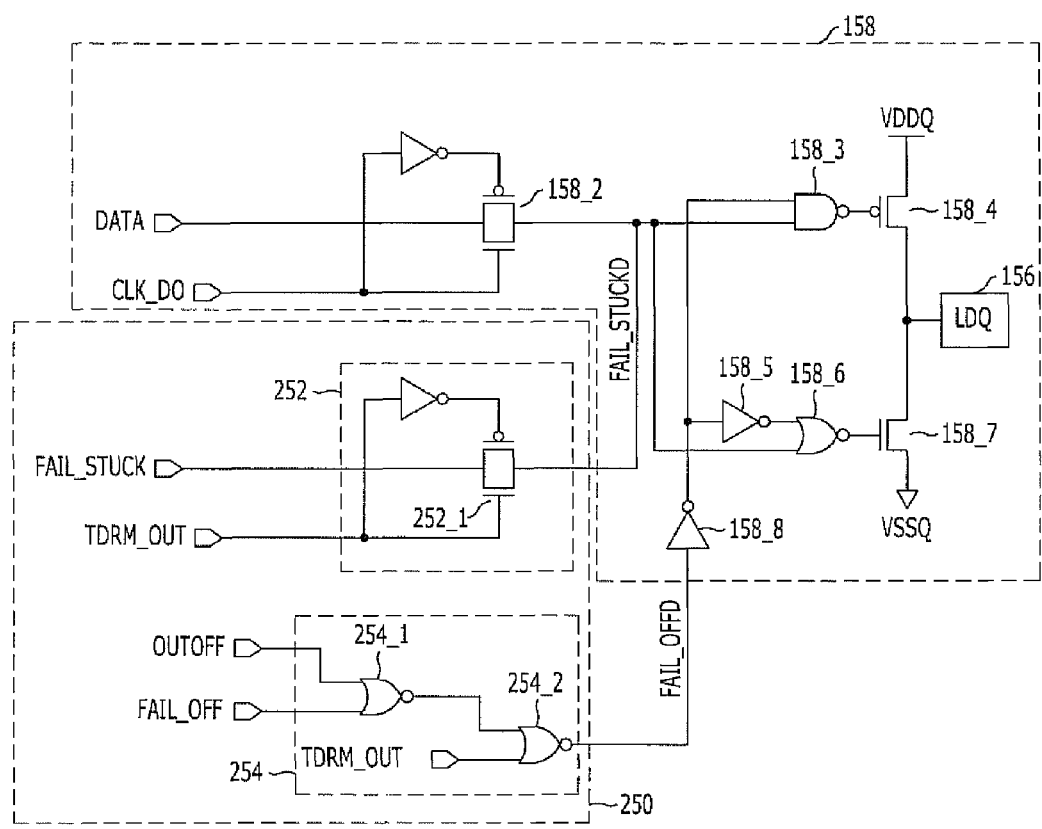
FIG. 7 is a circuit diagram illustrating a fail signal output unit and an output driver shown in FIG. 2.

FIG. 7 is a circuit diagram illustrating the fail signal output unit 250 and the output driver 158 shown in FIG. 2.

Referring to FIG. 7, the fail signal output unit 250 includes a fail-stuck signal output unit 252 and a fail-off signal output unit 254. The fail-stuck signal output unit 252 receives the first test signal FAIL_STUCK and outputs the fail-stuck signal FAIL_STUCKD in response to the test output signal TDRM_OUT. The fail-off signal output unit 254 receives the second test signal FAIL_OFF and outputs the fail-off signal FAIL_OFFD in response to the test output signal TDRM_OUT and the off-driver signal OUTOFF.

The fail-stuck signal output unit 252 may be implemented with a transfer gate 252_1 configured to selectively output the first test signal FAIL_STUCK as the fail-stuck signal FAIL_STUCKD in response to the test output signal TDRM_OUT.

The fail-off signal output unit 254 includes first and second NOR gate 254_1 and 254_2. The first NOR gate 254_1 performs a NOR operation on the second test signal FAIL_OFF and the off-driver signal OUTOFF, and the second NOR gate 254_2 performs a NOR operation on the test output signal TDRM_OUT and an output of the first NOR gate 254_1.

In a case where the test output signal TDRM_OUT is activated, the transfer gate 252_1 outputs the first test signal FAIL_STUCK as the fail-stuck signal FAIL_STUCKD, and the first and second NOR gates 254_1 and 254_2 inactivate the fail-off signal FAIL_OFFD regardless of the second test signal FAIL_OFF or the off-driver signal OUTOFF. On the contrary, in a case where the test output signal TDRM_OUT is inactivated, the transfer gate 252_1 is disabled, and the first and second NOR gates 254_1 and 254_2 activate and output the fail-off signal FAIL_OFFD in response to an activation of any of the second test signal FAIL_OFF and the off-driver signal OUTOFF. Here, in the package test mode, the test output signal TDRM_OUT is activated after the test data of the GIO line GIO_L are outputted through the data pad LDQ by the pipe latch unit 151 shown in FIG. 1.

As described above, the fail signal output unit 250 selectively outputs the first test signal FAIL_STUCK or the second test signal FAIL_OFF in response to the test output signal TDRM_OUT.

Meanwhile, the output driver 158 includes a transfer gate 158_2, a NAND gate 158_3, a NOR gate 158_6, inverters 158_5 and 158_8, a pull-up driver 158_4, and a pull-down driver 158_7.

The transfer gate 158_2 receives input data DATA in response to a clock signal CLK_DO. The NAND gate 158_3 performs a NAND operation on the fail-stuck signal FAIL_STUCKD and an inverted signal of the fail-off signal FAIL_OFFD. The inverter 158_8 outputs the inverted signal of the fail-off signal FAIL_OFFD by inverting the fail-off signal FAIL_OFFD, and the inverter 158_5 inverts an output of the inverter 158_8 to output a signal having a phase substantially the same as the fail-off signal FAIL_OFFD. The NOR gate 158_6 performs a NOR operation on the fail-stuck signal FAIL_STUCKD and an output of the inverter 158_5. The pull-up driver 158_4 and pull-down driver 158_7 are turned on/off in response to outputs of the NAND gate 158_3 and the NOR gate 158_6, respectively.

In the normal mode, both of the first and second test signals FAIL_STUCK and FAIL_OFF are inactivated. During a read operation, the output driver 158 pull-up or pull-down drives the input data DATA in response to the clock signal CLK_DO. After the read operation is finished, since the off-driver signal OUTOFF is activated, the fail-off signal FAIL_OFFD is activated, and thus, both the pull-up driver 158_4 and the pull-down driver 158_7 are turned off. As a result, the data pad LDQ is in a high-impedance state after the read operation is finished.

During the package test mode, since the test output signal TDRM_OUT is activated after data of the GIO line GIO_L are outputted to the data pad LDQ, the fail-stuck signal output unit 252 outputs the fail-stuck signal FAIL_STUCKD based on the first test signal FAIL_STUCK. At this time, due to the activated test output signal TDRM_OUT, the fail-off signal FAIL_OFFD is inactivated. When the fail-stuck signal FAIL_STUCKD is activated due to a failure, the pull-up driver 158_4 is turned on while the pull-down driver 158_7 is turned off. Accordingly, the data pad LDQ becomes a supply voltage level, and maintains a high-stuck state in response to the fail-stuck signal FAIL_STUCKD.

During the module test mode, since the test output signal TDRM_OUT is inactivated, the fail-off signal output unit 254 outputs the fail-off signal FAIL_OFFD based on the second test signal FAIL_OFF and the off-driver signal OUTOFF. At this time, due to the inactivated test output signal TDRM_OUT, the fail-stuck signal FAIL_STUCKD is inactivated. When the fail-off signal FAIL_OFFD is activated due to a failure, both the pull-up driver 158_4 and the pull-down driver 158_7 are turned off. As a result, the data pad LDQ is in a high-impedance state.

Hereinafter, referring to FIGS. 1 to 8C, an operation of the semiconductor memory device is explained in more detail.

Figure 8A:
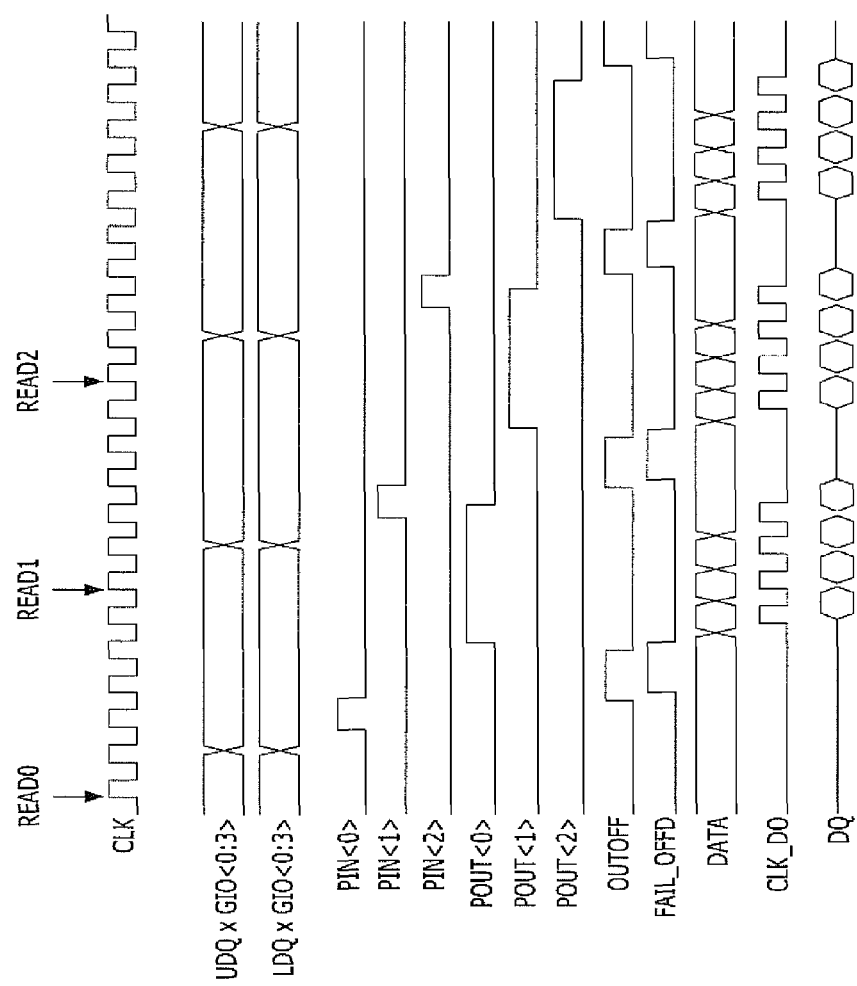
FIGS. 8A to 8C are timing diagrams illustrating an operation of a semiconductor memory device in accordance with an exemplary embodiment of the present invention.
Figure 8B:
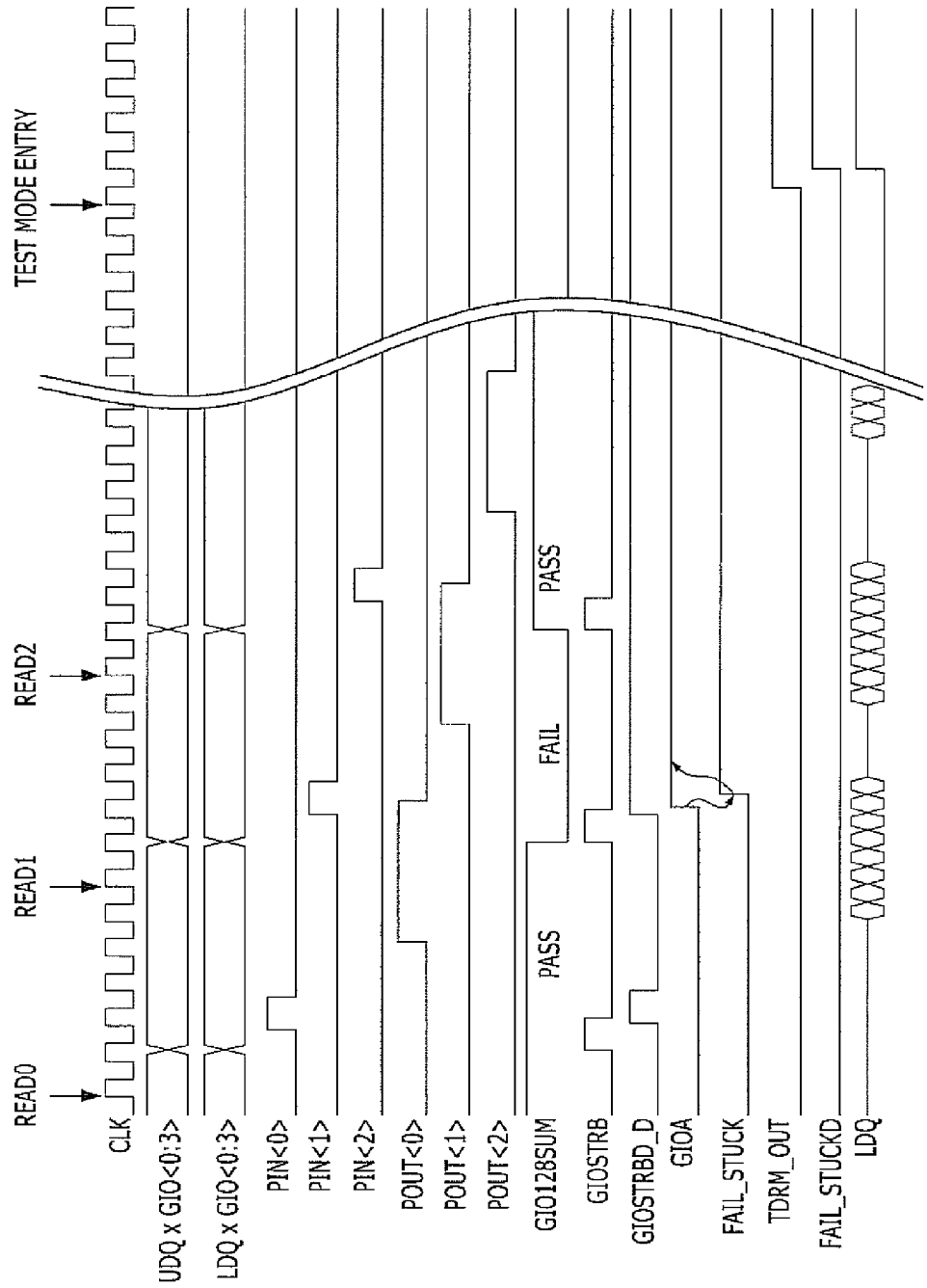
Figure 8C:
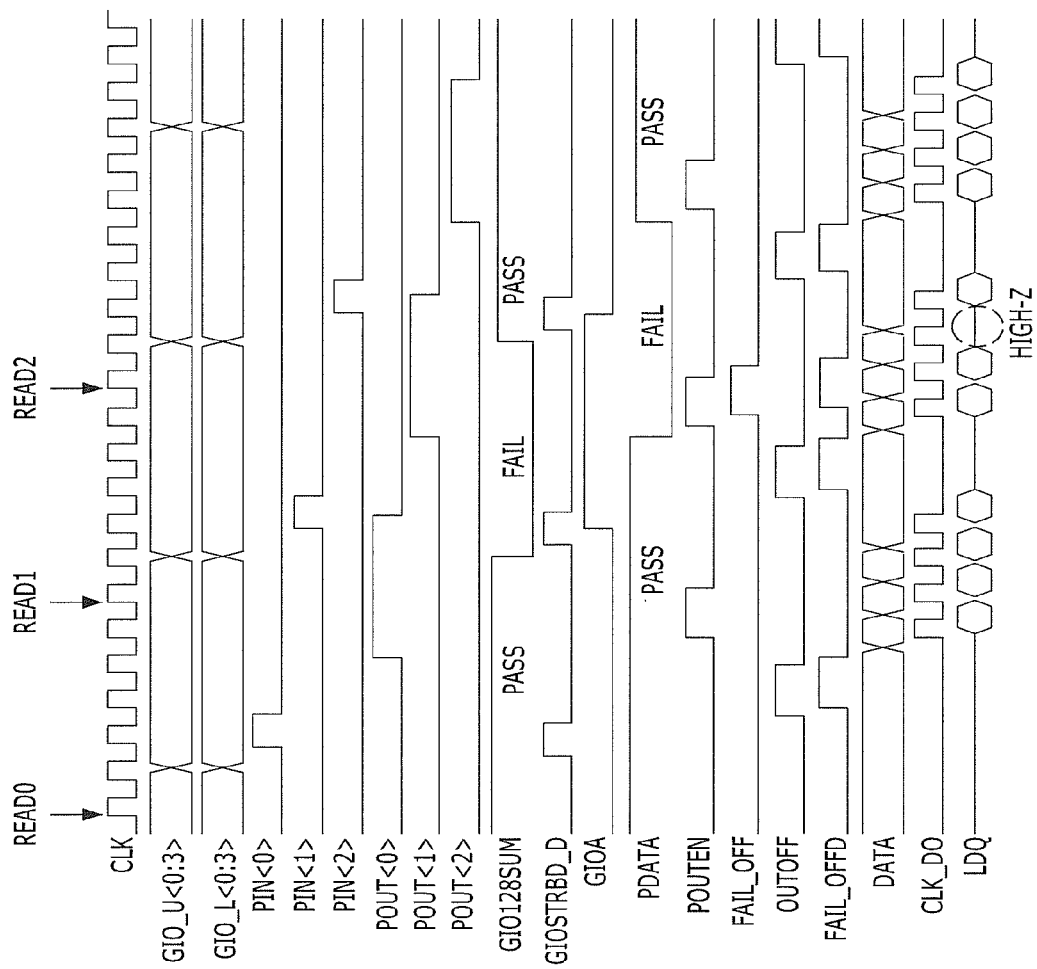

FIGS. 8A to 8C are timing diagrams illustrating an operation of a semiconductor memory device in accordance with an exemplary embodiment of the present invention. More specifically, FIG. 8A is a timing diagram illustrating an operation in the normal mode, FIG. 8B is a timing diagram illustrating an operation of the package test mode, and FIG. 8C is a timing diagram illustrating an operation of the module test mode.

Referring to FIG. 8A, in the normal mode, data stored in the respective memory cells in the banks are loaded on the corresponding GIO lines GIO_L and GIO_U when a read command is input. The pipe latch units 151 and 169 receive and latch the data of the GIO lines GIO_L and GIO_U in response to the pipe latch input control signals PIN<0:4>, and output the data to the data pads LDQ and UDQ in response to the pipe latch output control signals POUT<0:4>. For reference, the off-driver signal OUTOFF is inactivated to a logic low level during each read operation, and activated to a logic high level after each read operation is finished. The fail-off signal output unit 254 outputs the fail-off signal FAIL_OFFD in response to the off-driver signal OUTOFF after each read operation is finished. Accordingly, both of the pull-up driver 158_4 and the pull-down driver 158_7 are turned off, and thus, the data pad LDQ is in a high-impedance state whenever each read operation is finished.

Referring to FIG. 8B, in the package test mode, data stored in the respective memory cells of the banks are loaded on the corresponding GIO lines GIO_L and GIO_U when a read command is input. The fail detection unit 210 of the test mode control unit 200 compares data UDQxGIO<0:7> of the GIO lines GIO_U with data LDQxGIO<0:7> of the GIO lines GIO_L to output the fail detection signal GIO128SUM. The latch unit 220 latches the fail detection signal GIO128SUM in response to the strobe signal GIOSTRB activated in synchronization with each read command.

When any of the data UDQxGIO<0:7> of the GIO lines GIO_U is different from a corresponding one of the data LDQxGIO<0:7> of the GIO lines GIO_L, the fail detection signal GIO128SUM is inactivated and the fail latch signal GIOA is activated. At this time, since the mode decision signal TDRM_MD is inactivated in the package test mode, the feedback unit 223 feeds back the activated fail latch signal GIOA to the combination unit 225, and the combination unit 225 outputs the clock signal GIOSTRBD_D to be stuck at a certain logic level. As a result, the latch unit 220 outputs the fail latch signal GIOA to be stuck at a certain logic level once the fail detection signal GIO128SUM is inactivated, regardless of the strobe signal GIOSTRB.

The first test signal generation unit 230 generates the first test signal FAIL_STUCK based on the fail latch signal GIOA and the mode decision signal TDRM_MD while the second test signal generation unit 240 inactivates the second test signal FAIL_OFF. When the test output signal TDRM_OUT is activated after the data of the GIO lines GIO_L are outputted through the data pad LDQ, the fail signal output unit 250 activates the fail-stuck signal FAIL_STUCKD to drive the data pad LDQ to a high/low-stuck state. Accordingly, in the package test mode, after the data of the GIO lines GIO_L are outputted through the data pad LDQ, the data pad LDQ may be driven to a high/low-stuck state so as to show a fail status.

Referring to FIG. 8C, in the module test mode, data stored in the respective memory cells of the banks are loaded on the corresponding GIO lines GIO_L and GIO_U when a read command is input. The fail detection unit 210 compares data UDQ×GIO<0:7> of the GIO lines GIO_U with data LDQ×GIO<0:7> of the GIO lines GIO_L to output the fail detection signal GIO128SUM. The latch unit 220 latches the fail detection signal GIO128SUM in response to the strobe signal GIOSTRB activated in synchronization with each read command.

When any of the data UDQ×GIO<0:7> of the GIO lines GIO_U is different from a corresponding one of the data LDQ×GIO<0:7> of the GIO lines GIO_L, the fail detection signal GIO128SUM is inactivated and the fail latch signal GIOA is activated. At this time, since the mode decision signal TDRM_MD is activated in the module test mode, the feedback unit 223 does not feed back the fail latch signal GIOA to the combination unit 225, and the combination unit 225 outputs the clock signal GIOSTRBD_D based on the delayed strobe signal GIOSTRBD. As a result, the D flip-flop 227 latches the fail detection signal GIO128SUM whenever the read command is input. Accordingly, in the module test mode, the latch unit 220 outputs the fail latch signal GIOA by detecting a fail status in real-time.

Meanwhile, the second test signal generation unit 240 receives the fail latch signal GIOA to generate the second test signal FAIL_OFF in response to the CAS latency signal LATENCY2D, the internal clock ICLK, the pipe latch input control signals PIN<0:4>, and the pipe latch output control signals POUT<0:4>.

In more detail, the pipe latch unit 245 of the second test signal generation unit 240 latches the fail latch signal GIOA in synchronization with the delayed pipe latch input control signals PIND<0:4> and the delayed pipe latch output control signals POUTD<0:4>, and outputs the pipe output data PDATA. The output enable signal generation unit 246 shifts the CAS latency signal LATENCY2D in synchronization with the internal clock ICLK, and outputs the pipe latch output enable signal POUTEN. Herein, the pipe output data PDATA is output at a timing synchronized with a timing for outputting data in the pipe latch units 151 and 169, and the pipe latch output enable signal POUTEN is activated for a certain duration after a corresponding one of the pipe latch output control signals POUT<0:4> is activated. The combination unit 244 activates the second test signal FAIL_OFF when the pipe output data PDATA is activated during the activation duration of the pipe latch output enable signal POUTEN.

The fail-off signal output unit 254 activates the fail-off signal FAIL_OFFD in response to an activation of the second test signal FAIL_OFF or the off-driver signal OUTOFF since the test output signal TDRM_OUT is inactivated in the module test mode. During the read operation, when the fail-off signal FAIL_OFFD is activated in response to the second test signal FAIL_OFF due to a fail, both the pull-up driver 158_4 and the pull-down driver 158_7 are turned off. As a result, when a fail occurs in the module test mode, the data pad LDQ is in a high-impedance state in real-time during the respective read operation. Further, after each read operation is finished, the fail-off signal FAIL_OFFD is activated in response to the off-driver signal OUTOFF, which is activated whenever each read operation is finished. Accordingly, both the pull-up driver 158_4 and the pull-down driver 158_7 are turned off, and thus, the data pad LDQ is in a high-impedance state whenever each read operation is finished.

In accordance with an exemplary embodiment of the present invention, in a test mode, data input from a data pad LDQ are simultaneously transferred to both GIO lines GIO_L and GIO_U, which are coupled to a plurality of unit cells in banks, and a test mode control unit compares data of the GIO lines GIO_U with data of the GIO lines GIO_L to output a fail signal based on a comparison result. Accordingly, a time for testing the plurality of unit cells in the banks can be reduced/decreased.

Furthermore, in accordance with an exemplary embodiment of the present invention, various methods for denoting a fail status in a test mode, such as a package test mode and a module test mode, are provided. For example, in the package test mode, the test mode control unit outputs the fail signal to maintain a certain logic level once the memory cells having a defect are detected. Thereafter, an output driver drives the data pad LDQ to be stuck in a high/low state in response to the test output signal. Meanwhile, in the module test mode, the test mode control unit outputs the fail signal in real-time by detecting a defect of the memory cells whenever a read command is input, and whenever the memory cells having a defect are detected, the output driver drives the DQ pad LDQ to a high-impedance state at the same time when a respective data is output.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, any numbers of elements illustrated and described herein are by way of example only. The present invention is limited only as defined in the following claims and equivalents thereof.

What is claimed is:
1. A semiconductor memory device, comprising:
  a plurality of banks, each including a plurality of first memory cells and a plurality of second memory cells;
  a first input/output unit configured to transfer first data between the first memory cells and a plurality of first data pads;
  a second input/output unit configured to transfer second data between the second memory cells and a plurality of second data pads;
  a path selection unit configured to transfer the first data which are input through the first data pads, to both the first and second memory cells, during a test mode; and
  a test mode control unit configured to compare the first data of the first and second memory cells, and to control the first data pads to denote a fail status based on a comparison result, during the test mode,
  wherein the test mode control unit comprises:
    a fail detection unit configured to compare the first data of the first memory cells with the first data of the second memory cells and to output a fail detection signal based on the comparison result;
    a latch unit configured to latch the fail detection signal and to output a fail latch signal in response to a test mode signal which is activated during the test mode, a mode decision signal for determining a test mode type, and a strobe signal which is toggled when a read command is input;
    a test signal generation unit configured to generate a test signal based on the fail latch signal and the mode decision signal; and a fail signal output unit configured to output a fail signal in response to the test signal.

2. The semiconductor memory device of claim 1, wherein, in a package test mode, the test mode control unit controls the first data pads to be in a stuck state after a read operation is finished.

3. The semiconductor memory device of claim 1, wherein, in a module test mode, the test mode control unit controls the first data pads to be in a high-impedance state in real-time during a read operation.

4. The semiconductor memory device of claim 1, further comprising an input/output driver configured to drive the first data pads to denote a fail status in response to the fail signal.

5. The semiconductor memory device of claim 1, wherein the fail detection unit comprises:
  a plurality of comparison units configured to compare the first data of the first memory cells with the first data of the second memory cells; and
  a summation unit configured to output the fail detection signal based on outputs of the comparison units.

6. The semiconductor memory device of claim 1, wherein the latch unit outputs the fail latch signal to be stuck at a certain logic level once the fail detection signal is inactivated, regardless of the strobe signal, when the mode decision signal is inactivated in a package test mode.

7. The semiconductor memory device of claim 1, wherein the latch unit outputs the fail latch signal by latching the fail detection signal in synchronization with the strobe signal when the mode decision signal is activated in a module test mode.

8. The semiconductor memory device of claim 1, wherein the latch unit includes:
  a delay control unit configured to delay the strobe signal and to output a delayed strobe signal;
  a feedback unit configured to feed back the fail latch signal in response to the mode decision signal, and output a fed-back fail latch signal;
  a combination unit configured to output a clock signal based on the delayed strobe signal and the fed-back fail latch signal; and
  a D flip-flop configured to output the fail latch signal by latching the fail detection signal in synchronization with the clock signal.

9. The semiconductor memory device of claim 1, wherein the test signal generation unit comprises:
  a first test signal generator configured to generate a first test signal based on the fail latch signal and the mode decision signal; and
  a second test signal generator configured to generate a second test signal based on the fail latch signal, the mode decision signal, a pipe latch control signal, a column address strobe (CAS) latency signal, and an internal clock signal.

10. The semiconductor memory device of claim 9, wherein the first test signal generator performs an AND operation on the fail latch signal and an inverted signal of the mode decision signal.

11. The semiconductor memory device of claim 9, wherein the second test signal generator generates the second test signal by synchronizing the fail latch signal to an output timing of data through the first and second data pads when the mode decision signal is activated.

12. The semiconductor memory device of claim 9, wherein the second test signal generator comprises:
  a delay control unit configured to delay the pipe latch control signal and to output a delayed pipe latch control signal;
  a pipe latch unit configured to sequentially latch the fail latch signal in synchronization with the delayed pipe latch control signal, and output a pipe output data;
  an output enable signal generation unit configured to generate a pipe latch output enable signal by shifting the CAS latency signal in synchronization with the internal clock signal; and
  a combination unit configured to output the second test signal based on the pipe output data and the pipe latch output enable signal.

13. The semiconductor memory device of claim 12, wherein the pipe latch unit comprises:
  an alignment unit configured to align the fail latch signal in synchronization with the delayed pipe latch control signal; and
  an inverter latch unit configured to invert and latch an output of the alignment unit to output the pipe output data.

14. The semiconductor memory device of claim 13, wherein the alignment unit comprises a plurality of delay units, each sequentially receiving the fail latch signal, and sequentially outputting the received data, in response to the respective delayed pipe latch control signal.

15. The semiconductor memory device of claim 12, wherein the output enable signal generation unit comprises:
  a shift unit configured to shift the CAS latency signal in synchronization with the internal clock signal; and
  an enable signal output unit configured to output the pipe latch output enable signal based on an output signal of the shift unit.

16. The semiconductor memory device of claim 15, wherein the shift unit comprises a plurality of D flip-flops, wherein a first D flip-flop latches the CAS latency signal in synchronization with the internal clock signal, and the other D flip-flops latch an output of the previous D flip-flop in synchronization with the internal clock signal.

17. The semiconductor memory device of claim 16, wherein the enable signal output unit generates the pipe latch output enable signal having an activated logic level for a duration between outputs of adjacent D flip-flops.

18. The semiconductor memory device of claim 9, wherein the fail signal output unit comprises:
  a first fail signal output unit configured to receive the first test signal and to output a first fail signal in response to a test output signal, which is activated after data are output through the first data pads; and
  a second fail signal output unit configured to receive the second test signal and to output a second fail signal in response to the test output signal and an off-driver signal, which is inactivated during a read operation.

19. The semiconductor memory device of claim 18, wherein the first fail signal output unit comprises a transfer gate configured to selectively output the first test signal as the first fail signal in response to the test output signal.

20. The semiconductor memory device of claim 18, further comprising an output driver configured to drive the first data pads to a stuck state in response to the first fail signal, or drive the first data pads to a high-impedance state in response to the second fail signal.

21. The semiconductor memory device of claim 1, wherein the path selection unit comprises a multiplexer configured to disconnect a path between the second data pads and the second memory cells.

22. The semiconductor memory device of claim 21, wherein the multiplexer disconnects the path in response to a test mode signal which is activated during the test mode.

23. An apparatus for testing a semiconductor memory device, the apparatus comprising:
- a fail detection unit configured to compare data of first memory cells with data of second memory cells and to output a fail detection signal based on the comparison result;
- a latch unit configured to latch the fail detection signal and to output a fail latch signal in response to a test mode signal which is activated during the test mode, a mode decision signal for determining a test mode type, and a strobe signal which is toggled when a read command is input;
- first and second test signal generation units configured to generate first and second test signals based on the fail latch signal and the mode decision signal; and
- a fail signal output unit configured to receive the first and second test signals, and output first and second fail signals in response to a test output signal, which is activated after data are output through data pads.

24. The semiconductor memory device of claim 23, further comprising an output driver configured to drive the data pads to a stuck state after the read operation is finished, in response to the second fail signal, and to drive the data pads to a high-impedance state in real-time during a read operation, in response to the first fail signal.

25. The semiconductor memory device of claim 23, wherein the fail detection unit comprises:
- a plurality of comparison units configured to compare the data of the first memory cells with the data of the second memory cells; and
- a summation unit configured to output the fail detection signal based on outputs of the comparison units.

26. The semiconductor memory device of claim 23, wherein the latch unit outputs the fail latch signal to be stuck at a certain logic level once the fail detection signal is inactivated, regardless of the strobe signal, when the mode decision signal is inactivated in a package test mode.

27. The semiconductor memory device of claim 23, wherein the latch unit outputs the fail latch signal by latching the fail detection signal in synchronization with the strobe signal, when the mode decision signal is activated in a module test mode.

28. The semiconductor memory device of claim 23, wherein the latch unit includes:
- a delay control unit configured to delay the strobe signal and to output a delayed strobe signal;
- a feedback unit configured to feed back the fail latch signal in response to the mode decision signal, and output a fed-back fail latch signal;
- a combination unit configured to output a clock signal based on the delayed strobe signal and the fed-back fail latch signal; and
- a D flip-flop configured to output the fail latch signal by latching the fail detection signal in synchronization with the clock signal.

29. The semiconductor memory device of claim 23, wherein the second test signal generation unit generates the second test signal by synchronizing the fail latch signal to an output timing of data outputted through data pads when the mode decision signal is activated.

30. The semiconductor memory device of claim 23, wherein the second test signal generation unit comprises:
- a delay control unit configured to delay a pipe latch control signal and to output a delayed pipe latch control signal;
- a pipe latch unit configured to sequentially latch the fail latch signal in synchronization with the delayed pipe latch control signal, and output a pipe output data;
- an output enable signal generation unit configured to generate a pipe latch output enable signal by shifting a CAS latency signal in synchronization with an internal clock signal; and
- a combination unit configured to output the second test signal based on the pipe output data and the pipe latch output enable signal.

31. The semiconductor memory device of claim 23, wherein the fail signal output unit comprises:
- a first fail signal output unit configured to receive the first test signal and to output the first fail signal in response to the test output signal; and
- a second fail signal output unit configured to receive the second test signal and to output the second fail signal in response to the test output signal and an off-driver signal, which is inactivated during a read operation.

32. A method for testing a semiconductor memory device, the method comprising:
- transferring data, which is input through a data pad, to first and second memory cells of a bank;
- comparing the data of the first memory cell with the data of the second memory cell to output a fail detection signal based on the comparison result;
- generating a fail latch signal by latching the fail detection signal in response to a mode decision signal for determining a test mode type, and a strobe signal which is toggled when a read command is input;
- generating a fail signal based on the fail latch signal and the mode decision signal; and
- driving the data pad to denote a fail status based on the fail signal,
- wherein the generating of the fail signal comprises:
  - generating a first test signal based on the fail latch signal when the mode decision signal is inactivated;
  - generating a second test signal by synchronizing the fail latch signal to an output timing of data outputted through the data pad, when the mode decision signal is activated; and
  - outputting the fail signal based on the first and second test signals in response to a test output signal, which is activated after data are output through the data pad.

33. The method of claim 32, wherein, in a module test mode, the data pad is driven to a high-impedance state in real-time during a read operation, and in a package test mode, the data pad is driven to a stuck state after the read operation is finished.

34. The method of claim 32, wherein the fail latch signal is generated by latching the fail detection signal in synchronization with the strobe signal when the mode decision signal is activated, and the fail latch signal is generated to be stuck at a certain logic level once the fail detection signal is inactivated, regardless of the strobe signal, when the mode decision signal is inactivated.

35. The method of claim 32, wherein the generating of the fail latch signal comprises:
- delaying the strobe signal to output a delayed strobe signal;
- feeding the fail latch signal back in response to the mode decision signal, and generating a fed-back fail latch signal;
- generating a clock signal based on the delayed strobe signal and the fed-back fail latch signal; and
- latching the fail detection signal in synchronization with the clock signal to generate the fail latch signal.

36. The method of claim 32, wherein the outputting of the fail signal comprises:
- receiving the first test signal and generating a first fail signal in response to the test output signal; and receiving the second test signal and generating a second fail signal in response to the test output signal and an off-driver signal, which is inactivated during a read operation.

37. The method of claim 36, wherein the driving of the data pad comprises:
   driving the data pad to a stuck state in response to the first fail signal; and
   driving the data pad to a high-impedance state in response to the second fail signal.

38. The method of claim 37, wherein the driving of the data pad to a stuck state is performed after a read operation is finished.

39. The method of claim 37, wherein the driving of the data pad to a high-impedance state is performed in real-time during a read operation.

* * * * *